United States Patent
Pentas et al.

(10) Patent No.: US 7,223,706 B2
(45) Date of Patent: May 29, 2007

(54) METHOD FOR FORMING PLASMA ENHANCED DEPOSITED, FULLY OXIDIZED PSG FILM

(75) Inventors: Katie H. Pentas, Palm Bay, FL (US); Mark D. Bordelon, Indialantic, FL (US); Jack H. Linn, Cadillac, MI (US)

(73) Assignee: Intersil Americas, Inc., Milipitas, CA (US)

( * ) Notice: Subject to any disclaimer, the term of this patent is extended or adjusted under 35 U.S.C. 154(b) by 267 days.

(21) Appl. No.: 10/953,573

(22) Filed: Sep. 30, 2004

(65) Prior Publication Data

US 2006/0001127 A1  Jan. 5, 2006

Related U.S. Application Data

(60) Provisional application No. 60/583,844, filed on Jun. 30, 2004.

(51) Int. Cl.
*H01L 21/31* (2006.01)
(52) U.S. Cl. .............. 438/787; 438/788; 257/E21.275
(58) Field of Classification Search .............. 438/787, 438/788; 257/E21.275
See application file for complete search history.

(56) References Cited

U.S. PATENT DOCUMENTS

| 6,042,901 A | * | 3/2000 | Denison et al. | 427/579 |
| 6,303,518 B1 | * | 10/2001 | Tian et al. | 438/758 |
| 7,080,528 B2 | * | 7/2006 | M'Saad et al. | 65/386 |

OTHER PUBLICATIONS

Lowrie, T.: "Development of a fully oxidized PECVD PSG film," *Semiconductor International*, pp. 105-111 (Aug. 2000).

* cited by examiner

*Primary Examiner*—William M. Brewster
(74) *Attorney, Agent, or Firm*—Barnes & Thornburg LLP

(57) ABSTRACT

A method of forming a plasma enhanced deposited oxide film on a substrate includes introducing into a chamber containing the substrate silane gas and a dopant gas such as phosphine. The chamber is pressurized and energy is applied to create a plasma. The energy may be a dual frequency energy. The gas rates and pressure are selected to produce a plasma enhanced deposited oxide film on a substrate having a Si—O—Si bond peak absorbance in the IR spectrum of at least 1092 $cm^{-1}$.

8 Claims, 1 Drawing Sheet

METHOD FOR FORMING PLASMA ENHANCED DEPOSITED, FULLY OXIDIZED PSG FILM

CROSS-REFERENCE

This application claims the benefit of U.S. Provisional Patent Application Ser. No. 60/583,844 filed on Jun. 30, 2004, which is incorporated herein by reference.

BACKGROUND AND SUMMARY OF THE DISCLOSURE

The present disclosure relates generally to an integrated circuit having oxide films and, more specifically, to a plasma enhanced deposited oxide film.

One method of deposition is chemical vapor deposition (CVD), which includes plasma enhanced chemical vapor deposition (PECVD). The other method is thermal oxidation (TO). Various devices in an integrated circuit may be affected by the charge retention in the oxide film. Specifically, in metal oxide silicon transistors, once the biasing of the device is removed, the oxide may retain various levels of charge. This would affect the turn off and/or reactivation of the device. Historically, CVD oxide films have retained more charge than thermal oxidized films because the film includes dangling atoms, which are not fully bonded to each other (namely, incomplete reacted species).

This problem is addressed in the article "Development of a Fully Oxidized PECVD PSG Film," *Semiconductor International*, p. 105 (August 2000). The suggested solution is to increase the $N_2O:SiH_4$ ratio and process pressure and using only high frequency RF power. The Si—O—Si bond peak wavelength in the infrared (IR) spectrum was 1091 $cm^{-1}$ for the CVD oxide film compared to 1095 $cm^{-1}$ for the TO oxide film.

The present disclosure has found that a modification of the PECVD process has substantially decreased the charge retention of the oxide and has improved the Si—O—Si bonding within the oxide so as to be more fully oxidized. This more fully oxidized bonding is reflected by an increase in the Si—O—Si bond peak wavelength in the IR spectrum. It is also capable of increased levels of doping, which have improved re-flow characteristics, as well as other characteristics.

The present method of forming a plasma enhanced deposited oxide film on a substrate includes introducing into a chamber containing the substrate silane gas and a dopant gas such as phosphine. The chamber is pressurized and energy is applied to create a plasma. The energy may be a dual frequency energy. The gas rates and pressure are selected to produce a plasma enhanced deposited oxide film on a substrate having a Si—O—Si bond peak absorbance in the IR spectrum of at least 1092 $cm^{-1}$. The oxide film uniformity has a standard deviation of 0.7% maximum.

These and other aspects of the present disclosure will become apparent from the following detailed description of the disclosure, when considered in conjunction with accompanying drawings.

DETAILED DESCRIPTION OF THE PREFERRED EMBODIMENTS

Figure 1:
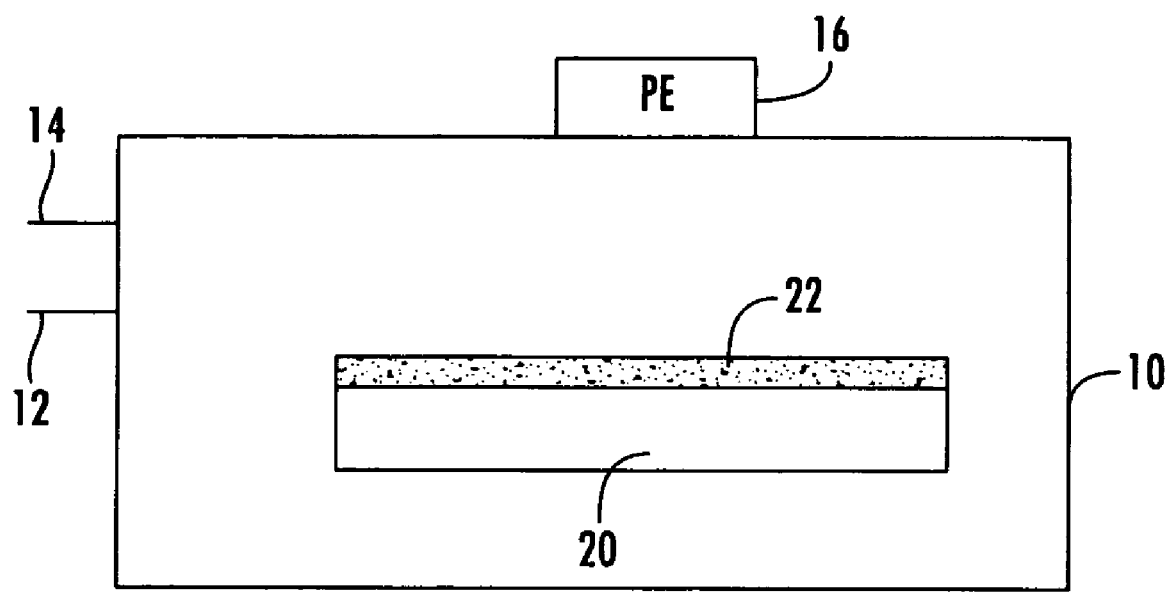
FIG. 1 is a diagram of an apparatus for carrying out the present method and the resulting integrated circuit.

A device or chamber 10 has multiple gas inlets 12 and 14. The plasma enhancement elements or energy source are schematically shown at 16. The chamber and the process is conducted to produce an oxide film 22 on a substrate 20.

An example of the system 10 may be a Novellus Concept 1 PECVD device. Since the device is well known, all other elements have been excluded, including the details of the plasma enhancing portion 16.

The following Table 1 shows the parameters of the current recipe and three examples of the new recipe wherein the flow rate of 9,500 sccm for $N_2O$ and 4,000 sccm for $N_2$ are the same for all recipes:

TABLE 1

| PARAMETER | PREVIOUS RECIPE | CURRENT RECIPE | NEW RECIPE A | NEW RECIPE B | NEW RECIPE C |
|---|---|---|---|---|---|
| Silane Flow | 200 sccm | 180 sccm | 200 sccm | 180 sccm | 180 sccm |
| Phosphine Flow | 540 sccm | 540 sccm | 670 sccm | 650 sccm | 680 sccm |
| HF Power | 40% | 40% | 60% | 60% | 60% |
| LF Power | 60% | 60% | 40% | 40% | 40% |
| Pressure | 2.6 T | 2.6 T | 3 T | 2.8 T | 2.8 T |
| Peak Wavelength | ~1086 $cm^{-1}$ | ~1089 $cm^{-1}$ | ~1092 $cm^{-1}$ | 1096.4 $cm^{-1}$ | 1092.3 $cm^{-1}$ |

A review of Table 1 will indicate that decreasing the silane flow or maintaining the same while substantially increasing the dopant or phosphine flow and increasing the pressure is provided by the present method. This causes an increase in the Si—O—Si bond peak wavelength in the IR spectrum, which is reflective of more complete and fully oxidized bonding within the silicon oxide film. The phosphorous content in the oxide may be in the range of 6% to 8%. This is an example for a silicon oxide formed on a silicon substrate. The more fully oxidized and completely reacted Si—O—Si bonding reduces the charge retention of the silicon oxide. This leads to improved performance of the integrated circuit devices. The resulting standard deviation of film uniformity of the oxide is generally in the range of 0.4% to 0.7%.

The dual frequency percentages have been changed with an increase of the percentage of high frequency power compared to low frequency power. The dual frequency also makes the film compressive. The deposition may be performed without the dual frequency if the compressive characteristics are not desired. The film of the present disclosure more closely resembles that of a thermal oxide film.

A detailed explanation of all of the gas flows for one example may be as follows: The silane flow is 180 sccm, 650 sccm for 3% phosphine, 9,500 sccm for $N_2O$ and 4,000 sccm for $N_2$. The pressure was 2.8 torrs. The deposition occurs at temperatures of 400° C.

The increase of the Si—O—Si peak wavelength to 1096 $cm^{-1}$ is substantial since 1096 $cm^{-1}$ is the highest thermal oxide peak absorbance. The increase in the Si—O—Si peak wavelength indicates nearly complete oxidation of the Si—O—Si bonding in the current PECVD film. In general, PECVD films have not even been able to reach this value, due to incomplete reaction of the reactant gases. As previously discussed, the standard deviation of film uniformity of the oxide in the experiments have been between 0.4% and 0.7%. It should also be noted that the stress of the film is compressive at $-1.44E8$ $dyne/cm^2$. The deposition rate was not compromised in the present process and remains at about 3,800 angstroms per minute.

Although the present disclosure has been described and illustrated in detail, it is to be clearly understood that this is done by way of illustration and example only and is not to be taken by way of limitation. The scope of the present disclosure is to be limited only by the terms of the appended claims.

What is claimed is:

1. A method of forming a plasma enhanced deposited oxide film on a substrate comprising:
   introducing into a chamber, containing the substrate, silane gas and a dopant gas;
   pressurizing the chamber;
   applying energy to the gases to create a plasma; and
   wherein the rate at which the gases are introduced and the pressure of the chamber are selected to produce a deposited oxide film having a peak absorption in the IR spectrum of at least 1092 $cm^{-1}$.

2. The method of claim 1, including applying a dual frequency energy.

3. The method of claim 2, wherein the high frequency energy is applied at a greater energy level than the low frequency energy is applied.

4. The method of claim 1, wherein the silane gas is introduced at a rate of at least 180 sccm, and the dopant gas is introduced at a rate of at least 600 sccm.

5. The method of claim 4, including introducing $N_2O$ gas at a flow rate of 9,500 sccm and $N_2$ gas at a flow rate of 4,000 sccm into the chamber.

6. A method of forming a plasma enhanced deposited oxide film on a substrate comprising:
   introducing into a chamber, containing the substrate, silane gas and phosphine gas;
   pressurizing the chamber;
   applying dual frequency energy to the gases to create a plasma, wherein the high frequency energy is applied at a greater energy level than the low frequency energy is applied; and
   wherein the rate at which the gases are introduced, the pressure of the chamber and the power of the plasma are selected to produce a deposited oxide film having a peak absorption in the IR spectrum of at least 1092 $cm^{-1}$.

7. The method of claim 6, wherein the silane gas is introduced at a rate of at least 180 sccm, and the phosphine gas is introduced at a rate of at least 600 sccm.

8. The method of claim 6, including introducing $N_2O$ and $N_2$ gases into the chamber.

* * * * *